United States Patent
Wakamatsu

(10) Patent No.: US 7,501,972 B2
(45) Date of Patent: Mar. 10, 2009

(54) REFERENCE VOLTAGE GENERATION CIRCUIT AND PIPE LINE ANALOG-TO-DIGITAL CONVERTER USING THE SAME

(75) Inventor: Takeshi Wakamatsu, Saitama (JP)

(73) Assignee: Oki Semiconductor Co., Ltd. (JP)

( * ) Notice: Subject to any disclaimer, the term of this patent is extended or adjusted under 35 U.S.C. 154(b) by 0 days.

(21) Appl. No.: 11/822,329

(22) Filed: Jul. 5, 2007

(65) Prior Publication Data
US 2008/0036639 A1 Feb. 14, 2008

(30) Foreign Application Priority Data
Aug. 10, 2006 (JP) ............... 2006-218124

(51) Int. Cl.
*H03M 1/12* (2006.01)
(52) U.S. Cl. .............. 341/155; 341/154; 341/161; 341/162; 323/313
(58) Field of Classification Search .......... 341/154, 341/161–163; 323/313
See application file for complete search history.

(56) References Cited

U.S. PATENT DOCUMENTS

| | | | | | |
|---|---|---|---|---|---|
| 6,100,837 | A | * | 8/2000 | Takeuchi | 341/161 |
| 6,157,335 | A | * | 12/2000 | Suzuki et al. | 341/154 |
| 6,288,662 | B1 | * | 9/2001 | Yoshizawa | 341/155 |
| 6,437,722 | B1 | * | 8/2002 | Yoshizawa | 341/154 |
| 6,486,820 | B1 | * | 11/2002 | Allworth et al. | 341/161 |
| 6,700,363 | B2 | * | 3/2004 | Tachimori | 323/313 |
| 7,205,922 | B2 | * | 4/2007 | Lee | 341/158 |

FOREIGN PATENT DOCUMENTS

| | | |
|---|---|---|
| JP | 09-055656 | 2/1997 |
| JP | 2001-168713 | 6/2001 |
| JP | 2001-285069 | 10/2001 |

* cited by examiner

*Primary Examiner*—Khai M Nguyen
(74) *Attorney, Agent, or Firm*—Studebaker & Brackett PC; Donald R. Studebaker

(57) ABSTRACT

A reference voltage generation circuit for a plurality of reference generation voltages and a pipe line analog-to-digital converter (ADC) using the same are provided. The reference voltage generation circuit including a charging capacitor for stabilizing the reference voltages charges the charging capacitor prior to the generation of the reference voltages, thus decreasing the time for the pipe line ADC to operate stably.

15 Claims, 9 Drawing Sheets

REFERENCE VOLTAGE GENERATION CIRCUIT AND PIPE LINE ANALOG-TO-DIGITAL CONVERTER USING THE SAME

BACKGROUND OF THE INVENTION

1. Field of the Invention

The present invention is related to a reference voltage generation circuit for generating a reference voltage and an ADC (Analog-to-Digital Converter) for converting an analog signal to a digital signal on the basis of the reference voltage, and in particular, relates to a reference voltage generation circuit for generating a plurality of reference voltages and a pipe line ADC using the same.

2. Description of the Related Art

A conventional pipe line ADC has a reference voltage generation circuit which generates a plurality of reference voltages to internal circuits. A conventional phase-locked loop circuit (hereinafter "PLL circuit") also has a reference voltage generation circuit. A reference voltage generation circuit, which generates a plurality of reference voltages to internal circuits having a large circuit dimension, includes an external capacitor with a large capacitance so as to stabilize the reference voltages and decrease electric power consumption. In the reference voltage generation circuit including the external capacitor with a large capacitance, it takes a long time to electrically charge the external capacitor, thus influencing a start-up duration of a pipe line ADC using the reference voltage generation circuit. Various improvements to solve the problem have been proposed. Technologies for overcoming the problem are disclosed in, for example, Japanese Patent Application Laid-Open Publication No. H09-55656 (document D1), Japanese Patent Application Laid-Open Publication No. 2001-168713 (document D2), and Japanese Patent Application Laid-Open Publication No. 2001-285069 (Document D3).

In the document D1, a PLL circuit which decreases a start-up duration at a power down mode is disclosed.

In the document D2, a pipe line ADC is described. In the document D3, an electric potential controlling circuit, which suppresses electric current consumption and decreases a start-up duration, is described.

The conventional pipe line ADC disclosed in the document D2 will now be described with reference to FIGS. 2 to 4 of the accompanying drawings. FIG. 1 is a block diagram showing the conventional pipe line ADC described in the document D2.

As shown in FIG. 1, the conventional pipe line ADC has an analog-to-digital (A/D) conversion part 1, an error correction circuit 16, a timing signal generation circuit 17, and a reference voltage generation circuit 20. The conventional pipe line ADC also has an input terminal VIN, a clock input terminal CLKX, and output terminals D0 to D9. The conventional pipe line ADC inputs continuous analog signals from the input terminal VIN thereof, converts sequentially continuous analog signals to digital signals in response to a clock signal from the clock input terminal CLKX, and then sequentially outputs the digital signals to the output terminals D0 to D9 thereof. The A/D conversion part 1 has pipe line ADC's of nine stages which sequentially convert continuous analog input signals provided from the input terminal VIN to digital signals. The error correction circuit 16, which receives the sequential digital signals generated by the A/D conversion part 1, corrects the digital signals and provides the corrected digital signals (for example, digital signals of ten bits, d0 to d9) to the output terminals D0 to D9, respectively. The timing signal generation circuit 17 generates timing signals trig to the A/D conversion part 1 in response to a clock signal clkx given from the clock input terminal CLKX. The Reference voltage generation circuit 20 outputs reference voltages (refp, vp1, refpq, cm, refnq, vn1, refn) from corresponding reference voltage output terminals (REFP, VP1, REFPQ, CM, REFNQ, REFNQ, VN1, REFN) to the A/D conversion part 1. Internal circuits of the A/D conversion part 1 operate on the basis of the reference voltages (refp, vp1, refpq, cm, refnq, vn1, refn).

The AD conversion part 1 is configured by a sampling and holding circuit 2 and nine pipe line stages (Stg1 to Stg9) 10-1 to 10-9. The nine pipe line stages (Stg1-Stg9) 10-1 to 10-9 are cascade-connected to the sampling and holding circuit 2. The sampling and holding circuit 2 operates on the basis of the reference voltage cm. The sampling and holding circuit 2 samples analog signals given to the input terminal IN in response to the timing signal trig and holds the analog signal for a given duration. The first to eight pipe line stages 10-1 to 10-8, which are cascade-connected to an output terminal of the sampling and holding circuit 2, sequentially convert the output analog signals generated by the sampling and holding circuit 2 into digital signals of 1.5 bits in response to the timing signals trig and the reference voltages refpq, refnq, refp, and refn. The first to eight pipe line stages 10-1 to 10-8 sequentially supply the digital signals of 1.5 bits to the error correction circuit 16. The ninth pipe line stage 10-9 converts an analog signal generated by the eighth pipe line stage 10-8 to a digital signal of 2 bits and supplies the digital signal of 2 bits to the error correction circuit 16 in response to reference voltage vp1, refpq, refnq, vn1, and a timing signal trig.

FIG. 2A is a block diagram showing first to eighth pipe line stages 10-1 to 10-8 (Stg1-Stg8) of FIG. 1, and FIG. 2B is a block diagram showing the ninth pipe line stage 10-9 (Stg9) of FIG. 1.

As shown in FIG. 2A, each of the first to eighth pipe line stages has a sub-ADC 11, a sub-DAC (sub-Digital-to-Analog Converter) 12, and an amplifier 14. Each of the first to eighth pipe line stages also has an input terminal to which an input analog signal vin is supplies and an output terminal from which an output analog signal vout is provided. The sub-ADC 11 compares the input analog signal vin to the reference voltages refpq, refnq, and encodes a resultant comparative signal so as to generate a digital signal of 1.5 bits. The sub-DAC 12 compares the digital signal of 1.5 bits generated by the sub-ADC 11 to the referential voltages refp, refn, and then converts a resultant comparative signal to an analog signal. The subtraction circuit 13 subtracts the analog signal generated by the sub-DAC 12 from the input analog signal vin. The amplifier 14 amplifies the analog signal generated by the subtraction circuit 13 by a factor of two times and then generates the amplified analog signal as an output analog signal vout.

As shown in FIG. 2B, the ninth pipe line stage 10-9 has an sub-ADC 15. The sub-ADC 15 compares an input analog signal vin (the output analog signal vout generated by the eighth pipe line stage 10-8) to the referential voltages vp1, refpq, refnq, and vn1, and encodes a resultant comparative signal so as to generate a digital signal of 2 bits.

FIG. 3 is a block diagram showing the sub-ADC 11 of FIG. 2A. The sub-ADC 11 has comparators 11a, 11b, and an encoder 11c. The comparator 11a and 11b compare an input analog signal vin and the reference voltages refpq, refnq, respectively, and generates resultant comparative signals, respectively. By encoding the respective comparative resultant signals generated by the comparators 11a and 11b, the encoder 11c generates a digital signal.

Operations of the pipe line ADC shown in FIGS. 1 to 3 will now be described. An analog signal given to an input terminal VIN of FIG. 1 is supplied to the sampling and holding circuit 2. The sampling and holding circuit 2 samples and holds the analog signal. And then the analog signal is given to the first pipe line stage 10-1 as a input analog signal vin. In the first pipeline stage 10-1 shown in FIGS. 2A and 3, the comparators 11a and 11b compare the input analog signal vin generated by the sampling and holding circuit 2 to the reference voltages refpq, refnq, respectively. The encoder 11c encodes resultant comparative signals to a digital signal of 1.5 bits. Therefore, the input analog signal vin is converted into the digital signal of 1.5 bits by the first pipe line stage 10-1. The digital signal of 1.5 bits is supplies to the error correcting circuit 16 and the sub-DAC 12.

The sub-DAC 12 converts the digital signal of 1.5 bits from the sub-ADC 11 to an analog signal and supplies the analog signal to the subtraction circuit 13. The subtraction circuit 13 subtracts the analog signal generated by sub-DAC12 from the input analog signal vin and supplied the subtracted analog signal to the amplifier 14. The amplifier 14 amplifies the subtracted analog signal by a factor of two times and supplies the amplified analog signal to the second pipe line stage 10-2.

The second to eighth pipe line stages 10-2 to 10-8 operates in the same way as the first pipe line stage 10-1. An amplified analog signal generated by the eighth pipe line stage is given to the ninth pipe line stage 10-9 as an input analog signal vin. The sub-ADC 15 of the ninth pipe line stage 10-9 shown in FIG. 2B compares an input analog signal vin, which corresponds to the amplified analog signal generated by the eighth pipe line stage, to the reference voltages vp1, refpq, refnq, and vn1 and encodes a resultant comparative signal so as to generate a digital signal of 2 bits to the error correction circuit 16.

The correction circuit 16 sequentially corrects errors in the digital signals respectively generated by the first to ninth pipe line stages 10-1 to 10-9, and supplies the corrected digital signals d0 to d9, each corresponding to the input analog signals from the input terminal VIN, to the output terminals D0 to D9, respectively.

Subsequently, the reference voltage generation circuit 20 shown in FIG. 1 will now be described with reference to FIG. 4. FIG. 4 is a circuit diagram showing the reference voltage generation circuit 20 of FIG. 1. As shown in FIG. 4, the reference voltage generation circuit 20 has an electric current source 21 and nine resistors 22-1 to 22-9, which are arranged in a LSI chip. The electric current source 21 flows a substantially constant electric current. The electric current source 21 has two P channel type MOS transistors (PMOSs) 21a and 21b whose gates are controlled by bias voltages vpbias1 and vpbias2, respectively. The PMOSs 21a and 21b are connected in series across a power terminal VDD and a reference voltage output terminal REFP.

The nine resistors 22-1 to 22-9 are connected in series across the reference voltage output terminal REFP and an earth terminal GND. A reference voltage output terminal VP1 is connected across the resistors 22-1 and 22-2. A reference voltage output terminal REFPQ is connected across the resistors 22-3 and 22-4. A reference voltage output terminal CM is connected across the resistors 22-4 and 22-5. A reference voltage output terminal REFNQ is connected across the resistors 22-5 and 22-6. A reference voltage output terminal VN1 is connected across the resistors 22-7 and 22-8. A reference voltage output terminal REFN is connected across the resistors 22-8 and 22-9.

The reference voltage output terminals REFP and REFN, both of which are provided in the LSI chip, are respectively connected to pads REFP_PAD and REFN_PAD outside the LSI chip. Across the pads REFP_PAD and REFN_PAD, an external capacitor 23 is connected. An input range of the input analog signal of the conventional pipe line ADC is dependent upon a difference between the reference voltage refp on the terminal REFP and the reference voltage refn on the terminal REFN. A reference voltage cm on the terminal CM is utilized as a common mode voltage of the conventional pipe line ADC. Reference voltages vp1, vn1, refpq, and refnq on corresponding reference voltage output terminals VP1, VN1, REFPQ, and REFNQ are utilized as the reference voltages supplied to the comparator 11a and 11b of the conventional ADC.

The reference voltage generation circuit 20 of the conventional pipe line ADC is provided with the external capacitor 23 outside of the LSI chip. The conventional pipe line ADC is turned on at the same time of the generations of the reference voltages and the charging of the external capacitor 23. Thus, it takes much time to increase the difference between the reference voltage refp on the terminal REFP and the reference voltage refn on the terminal REFN to a predetermined level. The difference between the reference voltages is dependent upon the input range of the input analog signal of the ADC. Therefore, there was a difficulty of increasing the time necessary for stabilizing the A/D converting operation after the conventional pipe line ADC is turned on or after the power down mode is released.

To solve the problem, it is considered that technologies disclosed in documents 1 and 3 are applied to the reference voltage generation circuit 20 disclosed in document D2. Since the reference voltage generation circuit 20 is completely different from the circuit structures disclosed in the documents D1 and D3, the technologies disclosed in the documents 1 and 3 can not be simply applied to the conventional reference voltage generation circuit 20, so that the problem has not been easily solved by providing a reference voltage generation circuit having a relatively simple circuit structure.

SUMMARY OF THE INVENTION

It is an object of the present invention to provide a reference voltage generation circuit capable of decreasing a start-up time of a pipe line ADC and supplying stable reference voltages to the pipe line ADC.

According to a first aspect of the present invention, there is a provided a reference voltage generation circuit comprising a reference voltage generation part for generating a plurality of reference voltages on corresponding reference voltage output terminals, a charging capacitor having a charging terminal, and a charging and switching part for disconnecting the charging capacitor from the reference voltage generation part so as to charge the charging capacitor and thereafter for stopping charging of the charging capacitor and connecting the charging capacitor to the reference voltage generation part in response to a terminal voltage of the charging capacitor. Charging of the charging capacitor is started prior to generations of the reference voltages.

According to a second aspect of the present invention, there is a provided a pipe line analog-to-digital converter comprising a reference voltage generation circuit including a reference voltage generation part for generating a plurality of reference voltages on corresponding reference voltage output terminals, a charging capacitor having a charging terminal, and a charging and switching part for disconnecting the charging capacitor from the reference voltage generation part so as to charge the charging capacitor and thereafter for stopping charging of the charging capacitor and connecting the charging capacitor to the reference voltage generation part in response to a terminal voltage of the charging capacitor, and an analog-to-digital conversion part for converting analog signals to digital signals on the basis of the reference voltages. Charging of the charging capacitor is started prior to generating the reference voltages.

According to the first aspect of the present invention, the reference voltage generation circuit includes the charge and switching part. Thus the charging capacitor is charged to a predetermined voltage level, and then connected to the reference voltage generation part. The reference voltage generation part, which is connected to the charging capacitor having the predetermined voltage level, generates the reference voltages, so that stable reference voltages are supplied to a pipe line ADC.

According to the second aspect of the present invention, the time for the pipe line ADC to operate stably can be decreased.

DETAILED DESCRIPTION OF THE INVENTION

Embodiments of the reference voltage generation circuit and the pipe line analog-to-digital converter according to the present invention will now be described.

FIRST EMBODIMENT

A first embodiment of the reference voltage generation circuit according to the present invention will now be described with reference to FIGS. 5 and 6.

Figure 1:
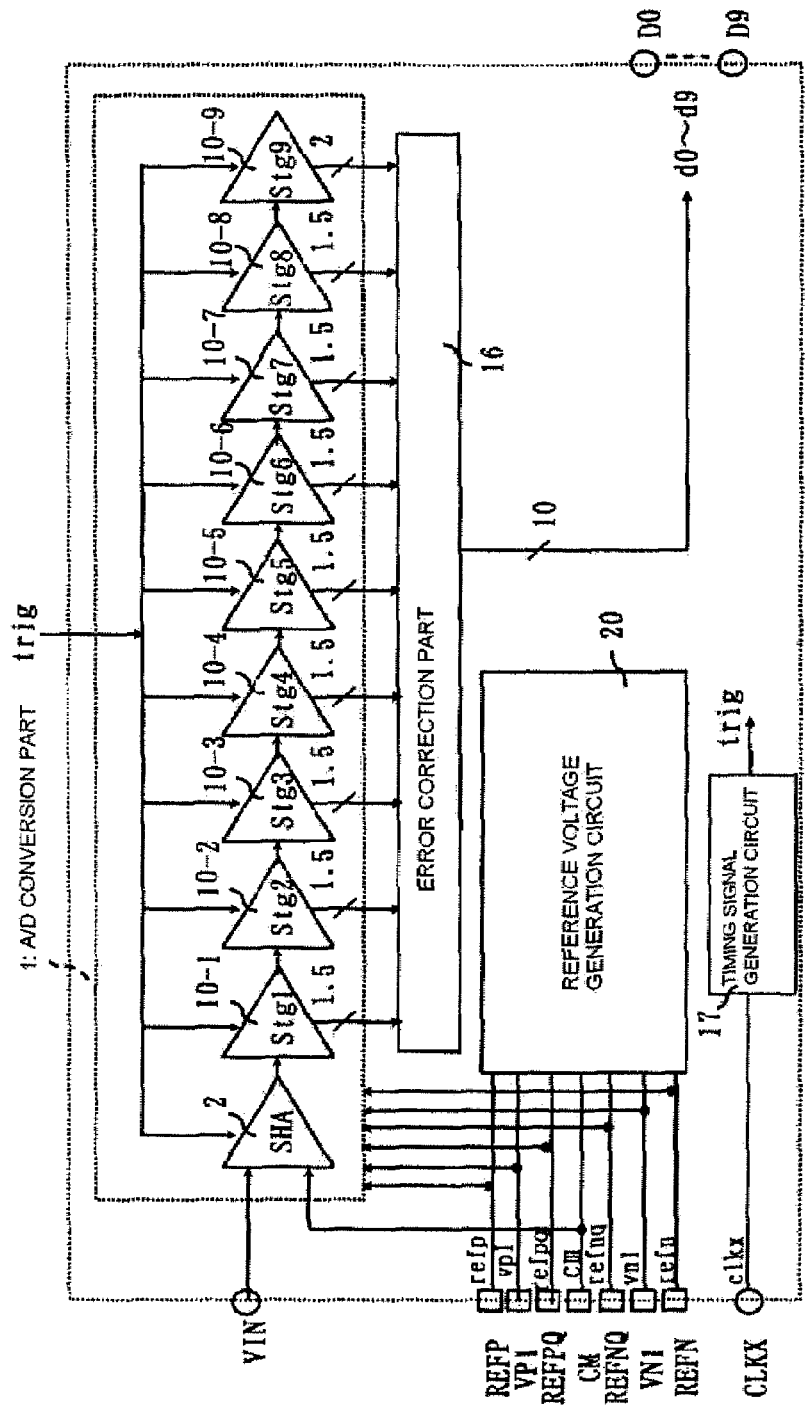
FIG. 1 is a schematic circuit diagram showing a conventional pile line ADC.
Figure 2A:
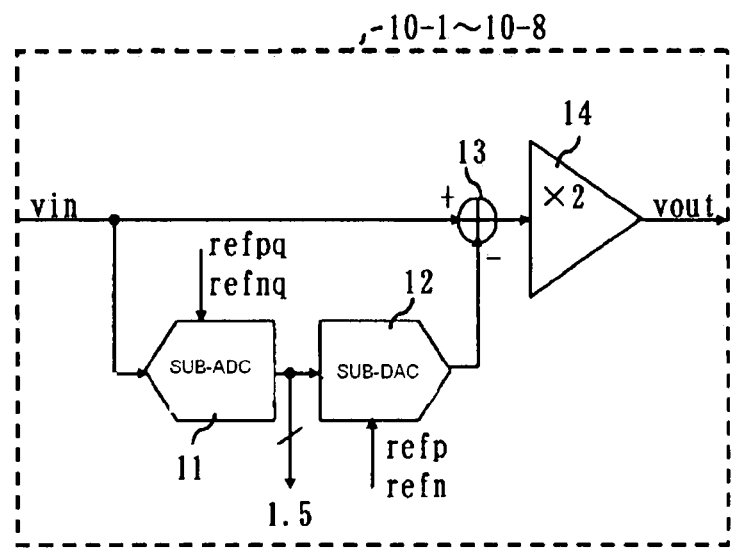
FIG. 2A is a schematic circuit diagram showing first to eighth pipe line stages of FIG. 1.
Figure 2B:
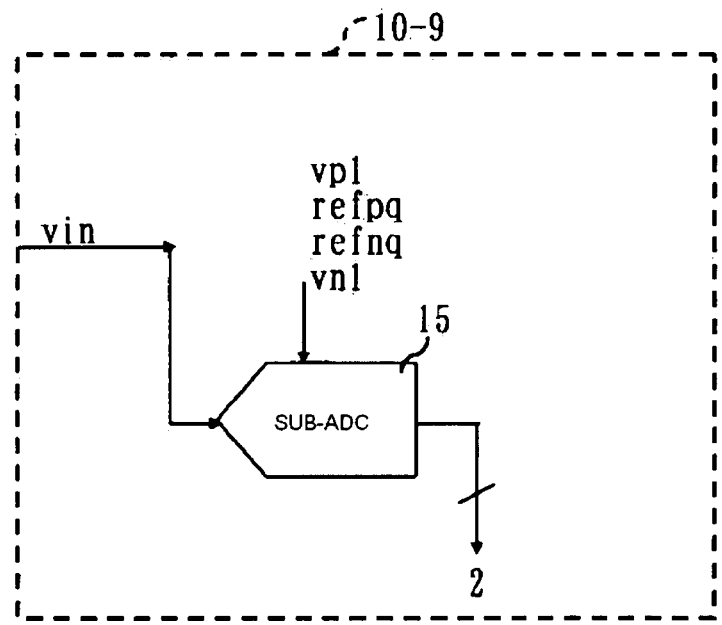
FIG. 2B is a schematic circuit diagram showing a ninth pipe line stage of FIG. 1.
Figure 3:
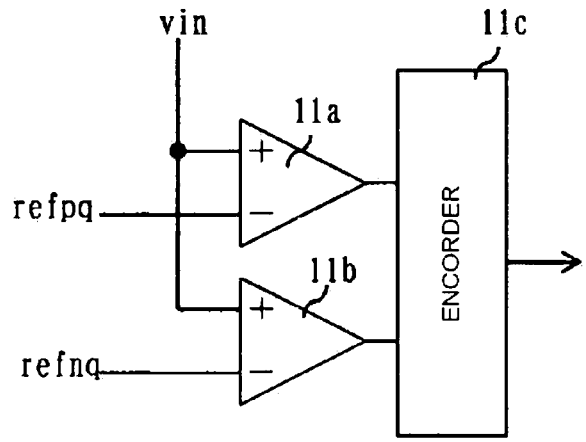
FIG. 3 is a schematic circuit diagram showing a sub-ADC 11 of FIG. 2A.
Figure 4:
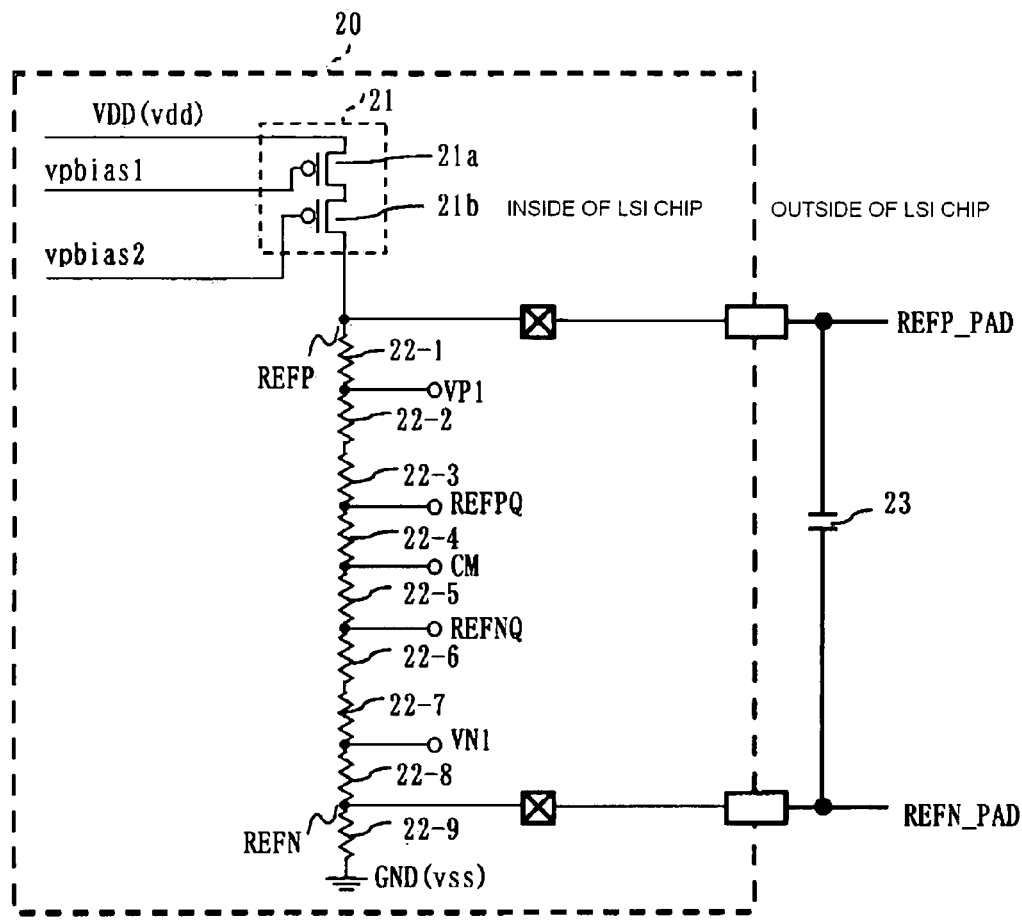
FIG. 4 is a schematic circuit diagram showing a reference voltage generation circuit of FIG. 1.

FIG. 1 is a circuit diagram showing the first embodiment of the reference voltage generation circuit according to the present invention.

Figure 5:
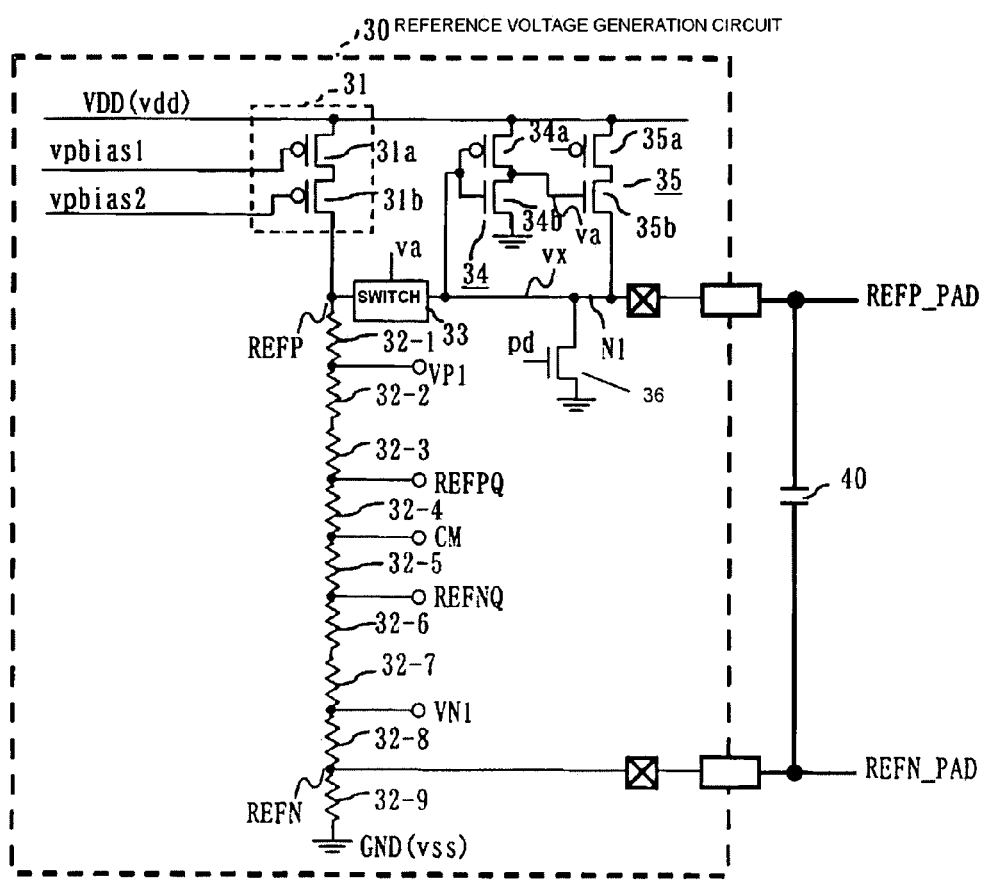
FIG. 5 is a schematic circuit diagram showing a first embodiment of the reference voltage generation circuit according to the present invention.

As shown in FIG. 5, the reference voltage generation circuit 30, which supplies a plurality of reference voltages to, for example, the pipe line ADC of FIG. 1, has an electric current source 31 for generating a substantially constant electric current and a reference voltage generating part (for instance, nine resistors 32-1 to 32-9). The electric current source 31 and the reference voltage generating part are provided in the same LSI chip. The electric current source 31 is configured by two PMOSs 31a and 31b whose gates are controlled by bias voltages vpbias1 and vpbias2, respectively. The PMOSs 31a and 31b are connected in series across a power terminal VDD and a reference voltage output terminal REFP. A power-supply voltage vdd is applied to the power terminal VDD. From the reference voltage output terminal REFP, a reference voltage refp is generated.

The nine resistors 32-1-32-9 are connected in series across the reference voltage output terminal REFP and an earth terminal GND to which an earth voltage vss is applied. A reference voltage output terminal VP1, from which a reference voltage vp1 is supplied, is connected across the resistors 32-1 and 32-2. In addition, a reference voltage output terminal REFPQ, from which a reference voltage refpq is supplied, is connected across the resistors 32-3 and 32-4. A reference voltage output terminal CM, from which a reference voltage cm is supplied, is connected across the resistors 32-4 and 32-5. A reference voltage output terminal REFNQ, from which a reference voltage refnq is supplied, is connected across the resistors 32-5 and 32-6. A reference voltage output terminal VN1, from which a reference voltage vn1 is supplied, is connected across the resistors 32-7 and 32-8. A second reference voltage output terminal REFN, from which a reference voltage refn is supplied, is connected across the resistors 32-8 and 32-9.

An input range of an input analog signal of the pipe line ADC of FIG. 1 is dependent upon a difference between the reference voltage refp on the terminal REFP and the reference voltage refn on the terminal REFN. The reference voltage cm on the terminal CM is utilized as a common mode voltage of the ADC. The reference voltages vp1, vn1, refpq, and refnq on corresponding terminal VP1, VN1, REFPQ, and REFNQ are utilized as reference voltages for comparators of the ADC.

Among the two reference voltage output terminals REFP and REFN in the LSI chip, the reference voltage output terminal REFP is connected to a pad REFP_PAD outside the LSI chip via a node N1. To the node N1, a charging and switching control part, which is not provided in the conventional reference voltage generation circuit, is connected. The reference voltage output terminal REFN is connected to a pad REFN_PAD outside the LSI chip. Across the pads REFP_PAD and REFN_PAD, an external capacitor 40 for electrically accumulating electric charge is connected.

The charging and switching control part is configured by a switch 33, a charging control part (for instance, an inverter 34), a charging circuit 35, and a discharging switch (for instance, an NMOS 36). The switch 33 includes a MOS transistor. The discharging switch discharges the external capacitor 40 so that the terminal voltage vx becomes the earth voltage.

The switch 33 connects and disconnects the reference voltage output terminal REFP to and from the node N1, to which the external capacitor 40 is connected via the pad REFP_PAD. The switch 33 is tuned on in response to a first charging control signal (for example, a "H" level charging control signal va), thus connecting the reference voltage output terminal REFP to the node N1. The switch 33 is turned off in response to a second charging control signal (for example, a "L" level charging control signal va), thus disconnecting the reference voltage output terminal REFP from the node N1. Until a terminal voltage vx on the node N1 becomes a predetermined voltage, the switch 33 maintains an off-state.

The inverter 34 connected to the terminal voltage vx outputs a charging control signal va in response to the terminal voltage vx. The inverter 34 has a PMOS 34a and an NMOS 34b, both of which are connected in series across the power terminal VDD and the earth terminal GND. Gate terminals of the PMOS 34a and NMOS 34b are connected to the node N1. The charging control signal va is generated from a node of drain terminals of the PMOS 34a and the NMOS 34b. The inverter 34 generates a "H" level charging control signal va when the terminal voltage vx is equal to or less than a threshold voltage vth thereof.

The inverter 34 also generates a "L" level charging control signal va when the terminal voltage vx is higher than the threshold voltage vth.

The charging circuit 35 electrically charges the external capacitor 40 in response to the charging control signal va. The charging circuit 35 has a PMOS 35a and an NMOS 35b, which are connected in series across the power terminal VDD and the node N1. The PMOS 35a is gate-controlled by a power down control signal pd, and the NMOS35b is gate-controlled by the charging control signal va.

The NMOS 36, which discharges the external capacitor 40, controls the terminal voltage vx to be the earth voltage vss at the power down mode. The NMOS 36 is gate-controlled by the power down control signal pd. The bias voltages vpbias 1 and 2 are generated by a bias voltage generation circuit (not shown). The power down control signal pd having "H" and "L" levels is generated by a power down control signal generation circuit (not shown). The "H" level power down control signal pd is switched to the "L" level power down control signal pd at the time when the power down mode is released. The pipe line ADC of FIG. 1 is turned on at the time of the release of the power down mode.

An operation of the first embodiment will now be described with reference to FIG. 6. FIG. 6 is a waveform chart showing an operation of the reference voltage generation circuit 30 of FIG. 1. In response to the bias voltages vpbias1, vpbias2, the PMOSs 31a and 31b are turned on, and thus the electric current source 31 generates a predetermined electric current to the resistors 32-1 to 32-9. Thus, reference voltages, each of which are proportional to electric currents through the resistors, are generated to the reference voltage output terminals, REFP, VP1, REFPQ, CM, VP1, REFNQ, VN1, REFN. It should be noted that an input range of an input analog signal of the ADC shown in FIG. 1 is dependent upon a difference between the reference voltage refp on the terminal REFP and the reference voltage refn on the terminal REFN.

Figure 6:
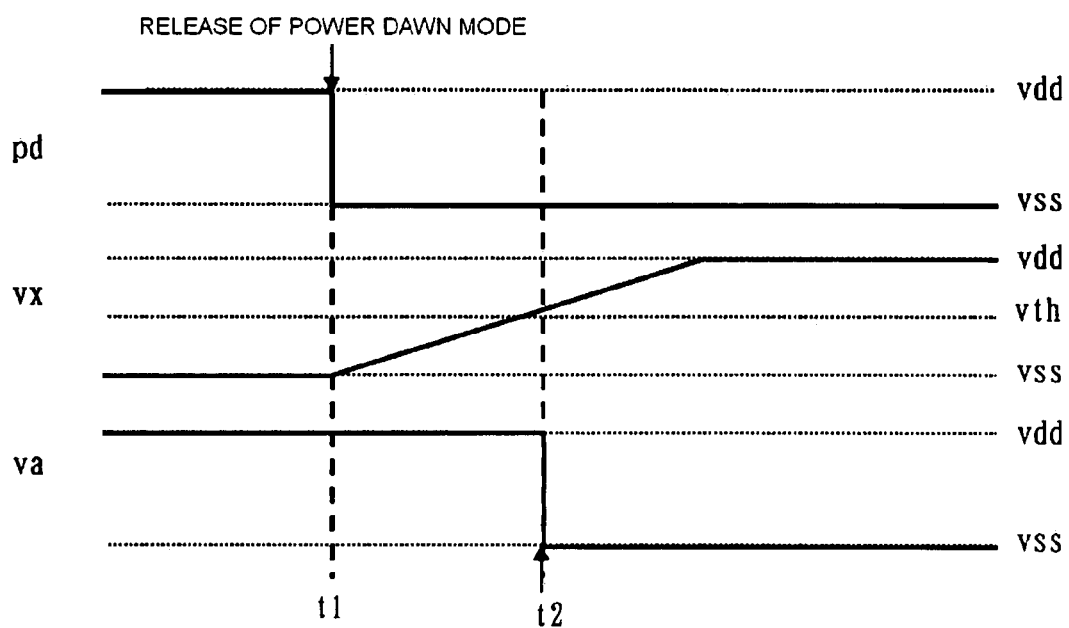
FIG. 6 is a timing chart showing an operation of the first embodiment of the reference voltage generation circuit according to the present invention.

As shown in FIG. 6, in a power down mode before time of t1, a first logic level (for example, "H"("vdd") level) power down control signal pd is generated to the gate terminals of the PMOS 35a and the NMOS 36. In response to the "H" ("vdd") level power down control signal pd, the PMOS 35a is in an off-state and the PMOS 36 is in an on-state. Since the PMOS 36 is in the on-state, the terminal voltage vx is a "L" ("vss") level. In response to the "L" ("vss") level terminal voltage vx, the PMOS 34a is in an on-state and NMOS 34b is in an off-state, and thus the inverter 34 generates a "H"("vdd") level charging control signal va to the gate terminals of NMOS 35b and the switch 33. In response to the "H"("vdd") level charging control signal va, the NMOS 35b is in an on-state and the switch 33 is in an off-state. In the power down mode before time of t1, the bias voltages vpbias1, vpbias2 are not generated to the gate terminals of the PMOSs 31a and 31b, and both of the PMOSs 31a and 31b are in an off-state. Thus, the predetermined electric current is not supplied to the resistors 32-1 to 32-9. All reference voltages on the corresponding the reference voltage output terminal REFP, VP1, REFPQ, CM, REFNQ, VN1, and REFN are the earth voltage of "vss" in the power down mode.

In response to a second logic level (for example, "L"("vss")) power down control signal pd at the time of t1, the power down mode is released. At the time of the t1, in response to the "L"("vss") power down control signal pd, the PMOS 35a is turned on and the NMOS 36 is in the off-state, thus increasing the terminal voltage vx from "L" ("vss") level toward "H"("vdd") level of the power-supply voltage via the PMOS 35a and NMOS 35b. Until the terminal voltage vx approaches to the threshold voltage vth, the PMOS 34a is in the on-state and the NMOS 34b is in the off-state, so that the inverter 34 maintains the generation of the "H"("vdd") level charging control signal to the gate terminal of the NMOS 35b and the switch 33. In response to the "H"("vdd") level charging control signal, the NMOS 35b is in the on-state and the switch 33 is in the off-state.

In response to the increase of the terminal voltage vx reaching the threshold voltage vth of the inverter 34 at the time of t2, the bias voltages vpbias1,vpbias2 are supplied to the gate terminals of the PMOSs 31a and 31b, thus the electric current source 31 generates the predetermined electric current to the resistors. At the same time of t2, in response to the increase of the terminal voltage vx, the PMOS 34a is turned off and the NMOS 34b is turned on, so that the inverter 34 generate a "L"("vss") level charging control signal va to the gate terminal of the NMOS 35b and the switch 33. In response to the "L"("vss") level charging control signal va, the NMOS 35b is turned off and the switch 33 is turned on, thus further increasing the terminal voltage vx from the threshold voltage vth to the "vdd" level.

The first embodiment is provided with the switch 33 for connecting and disconnecting the reference voltage output terminal REFP to and from the external capacitor 40, the charging circuit 35 for supplying the charge voltage to the external capacitor 40, the inverter 34 for controlling the switching operation of the switch 33 and the charging circuit 35, and the NMOS 36 for discharging the external capacitor 40.

After the power drwn mode is released (the pipe line ADC is turned on), the external capacitor 40 is started to be charged by the charging circuit 35 while the switch 33 is turned off. When the external capacitor 40 is charged to a predetermined level (the threshold voltage of inverter 34 vth), the inverter 34 controls the charging circuit 35 so that the charging circuit 35 stops the charging of the external capacitor 40. At the same time, the inverter 34 controls the switch 33 so that the switch 33 is turned on so as to connect the reference voltage output terminal REFP to the external capacitor 40. In synchronization with the connection of the external capacitor 40 to the reference voltage output terminal REFP, the reference voltages are generated to the pipe line ADC of FIG. 1 in response to the bias voltages vpbias 1 and 2, thus decreasing the time until operations of the A/D converter is stable.

SECOND EMBODIMENT

Figure 7:
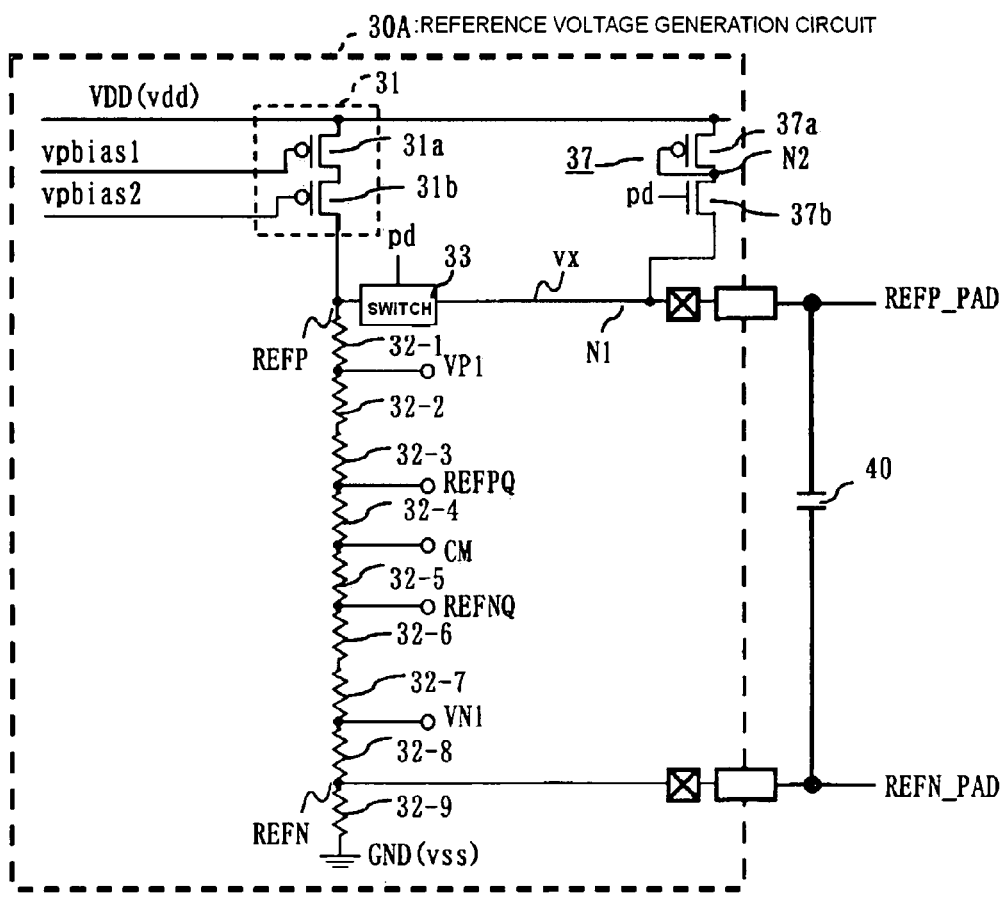
FIG. 7 is a schematic circuit diagram showing a second embodiment of the reference voltage generation circuit according to the present invention.

A second embodiment of the reference voltage generation circuit according to the present invention will now be described with reference to FIGS. 7 and 8. FIG. 7 is a circuit diagram showing the second embodiment of the present invention. Elements which perform similar operations as the first embodiment of FIG. 5 are denoted by the same numerals as the first embodiment. The second embodiment supplies a plurality of reference voltages to, for example, the pipe line ADC shown in FIG. 1.

The reference generation circuit 30A of the second embodiment also has a charging and switching control part whose configuration is different from that of the first embodiment. The charging and switching control part of the second embodiment is configured by a switch 33 and a charging circuit 37, both of which are on/off controlled by a power down control signal pd. The power down control signal pd is generated by a power down control signal generation circuit (not shown).

The switch 33 is connected across a reference voltage output terminal REFP and a node N1 via which an external capacitor 40 is connected. The switch 33 electrically connects and disconnects the reference voltage output terminal REFP to and from the external capacitor 40 in response to the power down control signal pd. The switch 33 is configured by a MOS transistor whose gate is controlled by the power down control signal pd. The switch 33 is tuned on in response to a "L" level power down control signal pd, thus connecting the reference voltage output terminal REFP to the external capacitor 40. The switch 33 is turned off in response to a "H" level power down control signal pd, thus disconnecting the reference voltage output terminal REFP to the external capacitor 40.

The charge circuit 37 electrically charges the external capacitor 40 to a predetermined charging level at the time of power down mode. The charge circuit 37 is configured by a PMOS 37a, anode N2, and an NMOS 37b. The PMOS 37a is diode-connected to the NMOS 37b via the node N2. The NMOS 37b is gate-controlled by the power down control signal pd. The PMOS 37a, the node N2, and the NMOS 37b are connected in series across a power electric terminal VDD and a node N1. Other elements are similar to the first embodiment.

An operation of the second embodiment will now be described with reference to FIG. 8. FIG. 8 is a waveform chart showing an operation of the reference voltage generation circuit 30A of FIG. 7. In response to bias voltages vpbias1, the PMOSs 31a and 31b is turned on, and thus the electric current source 31 generates a predetermined electric current to the resistors 32-1 to 32-9. Thus, reference voltages, each of which are proportional to electric currents through corresponding resistors, are generated from the reference voltage output terminals, REFP, VP1, REFPQ, CM, VP1, REFNQ, VN1, and REFN.

Figure 8:
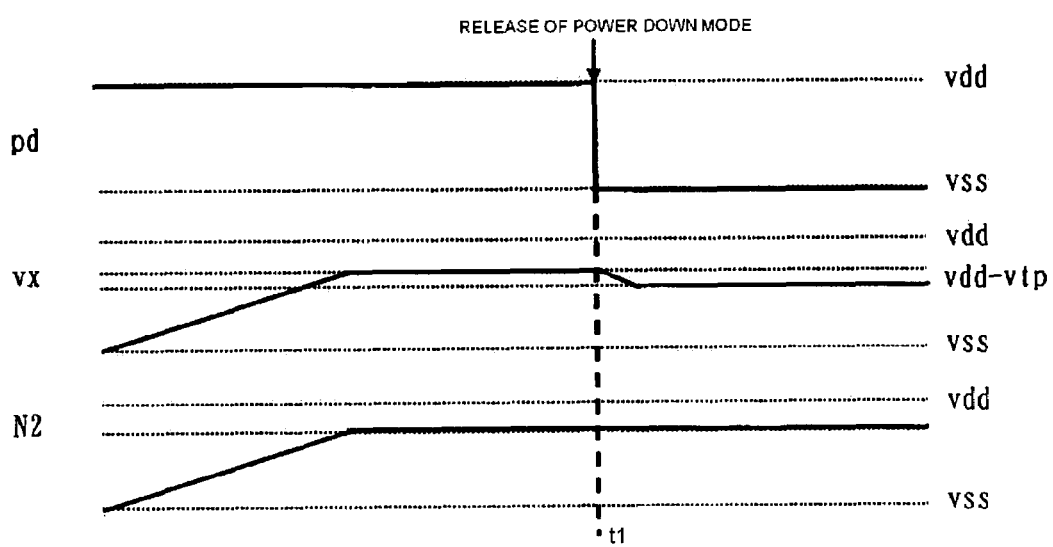
FIG. 8 is a timing chart showing an operation of the second embodiment of the reference voltage generation circuit according to the present invention.

As shown in FIG. 8, at a power down mode before the time of t1, a "H" ("vdd") level power down control signal pd is generated to the switch 33 and NMOS 37b, so that the switch 33 is in an off-state, and the NMOS 37b is in an on-state. The PMOS 37a, which is diode-connection to the NMOS 37b, gradually opens its gate, thus increasing a voltage at the node N2 toward a voltage given by vdd-vtp, where vtp is a threshold voltage of PMOS 37a. The terminal voltage on the node N1 increases accompanying with the increase of the voltage on the node N2 via the PMOS 37b, so that the external capacitor 40 is electrically charged to the level of vdd-vtp.

At the time of t1, the power down mode is released, which means that a "L"("vss") level power down control signal pd is supplied to the switch 33 and NMOS 37b. The bias voltages vpbias1, vpbias2 are supplied to PMOSs 31a and 31b, and thus reference voltages are generated from corresponding reference voltage output terminals. At the same time, in response to the "L"("vss") level power down control signal pd, the NMOS 37b is turned off, thus the charging circuit 37 stopping the charging of the external capacitor 40. At the same time, the switch 33 is turned on, thus decreasing the terminal voltage vx to a given voltage (reference voltage refp).

The second embodiment is provided with the switch 33 for connecting and disconnecting the reference voltage output terminal REFP to and from the external capacitor 40, the charging circuit 37 for supplying the charge voltage to the external capacitor 40 to a predetermined level prior to the generations of the reference voltages.

Until the power down mode is released (the pipe line ADC is turned on), the external capacitor 40 is charged to a predetermined charging level (vdd-vtp) by the charging circuit 37 while the switch 33 is turned off. When the external capacitor 40 is charged to the predetermined level (the threshold voltage of inverter 34 vth), the charging circuit 37 stops the charging of the external capacitor 40. The switch 33 so is turned on so as to connect the reference voltage output terminal REFP to the external capacitor 40. In synchronization with the connection of the external capacitor 40 to the reference voltage output terminal REFP, the reference voltages are generated to the pipe line ADC of FIG. 1 in response to the bias voltages vpbias1 and vpbias2, thus decreasing the time until operations of the A/D converter is stable.

THIRD EMBODIMENT

Figure 9:
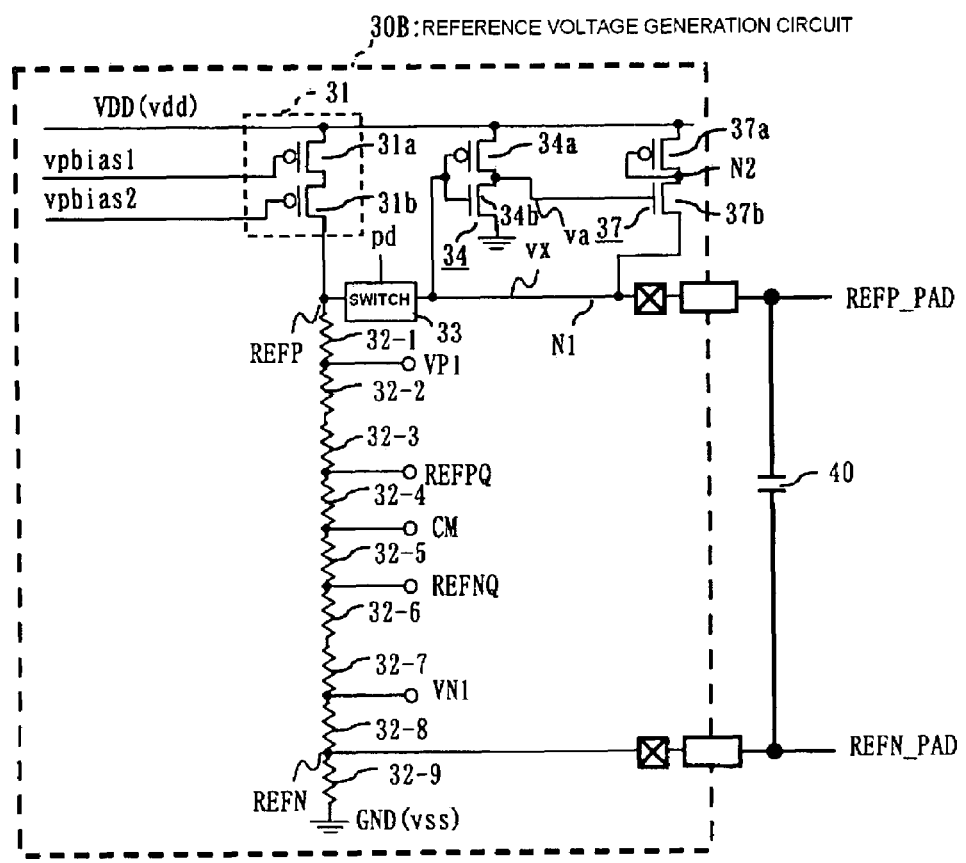
FIG. 9 is a schematic circuit diagram showing a third embodiment of the reference voltage generation circuit according to the present invention.

A third embodiment of the reference voltage generation circuit according to the present invention will now be described with reference to FIGS. 9 and 10. FIG. 9 is a schematic circuit diagram showing the third embodiment. Elements which perform the same operations as those of the first and second embodiments of FIGS. 5, 7 are denoted by the same numerals as the first and second embodiment. The second embodiment supplies a plurality of reference voltages to the pipe line ADC shown in FIG. 1.

The charging and switching control part 30B of the third embodiment is configured by a switch 33, a charging control part (for instance, an inverter 34b), both of which are on/off controlled by a power down control signal pd. The charging and switching control part 30B also configured by a charging circuit 37. The inverter 34 generates a charging control signal va to a gate terminal of an NMOS 37b of the charging circuit 37. Other elements are similar to those of the first and second embodiments.

An operation of the third embodiment will now be described with reference to FIG. 10. FIG. 10 is a waveform chart showing an operation of the reference voltage generation circuit 30B of FIG. 9. In response to bias voltages vpbias1, vpbias2, the PMOSs 31a and 31b is turned on, and thus the electric current source 31 generates a predetermined electric current to the resistors 32-1 to 32-9. Thus, reference voltages, each of which is proportional to electric currents through the corresponding resistor, are generated from the reference voltage output terminals, REFP, VP1, REFPQ, CM, VP1, REFNQ, VN1, and REFN, respectively.

Figure 10:
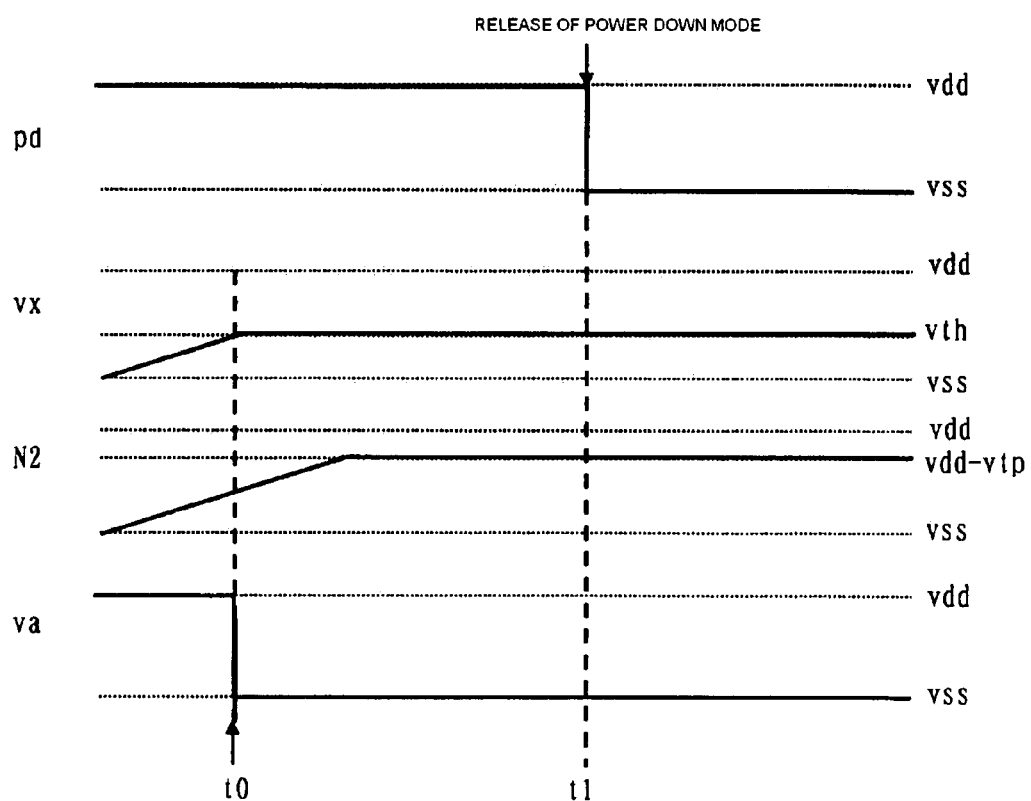
FIG. 10 is a timing chart showing an operation of the third embodiment of the reference voltage generation circuit according to the present invention.

As shown in FIG. 10, a "H"("vdd") level power down control signal pd at a power down mode before a time of t0 is supplied to the switch 33. In response to the "H"("vdd") level power down control signal pd, the switch 33 is in an off-state. Since a voltage on the node N1 is below a predetermined level (a threshold voltage vth of the inverter 34), a gate of the PMOS 34a is opened and a gate of the NMOS 34b is closed. Thus, the inverter 34 generates a "H"("vdd") level charging control signal va to the NMOS 37b. In response to the "H" ("vdd") level charging control signal va, the NMOS 37b is in an on-state. Since the PMOS 37a is diode-connection to the NMOS 37b via the node N2, a gate of the PMOS 37a is gradually opened, so that a terminal voltage vx on the N2 gradually increases toward a voltage level of vdd-vtp, where vtp is a threshold voltage of the PMOS 37a. In this way, the external capacitor 40, which is connected to the electric power voltage vdd via the PMOS 37b and the NMOS 37b, is preliminary charged, and thus the terminal voltage vx on the node N1 increases.

The terminal voltage vx reaches a predetermined level (the threshold voltage vth of the inverter 34) at the time of t0. In response to the terminal voltage vx of the predetermined level, the PMOS 34a connected to the electric power voltage vdd is turned off, and thus the inverter 34 generates a "L" ("vss") level charging control signal va to the NMOS 37b. In response to the "L" level charging control signal va, the NMOS 37b is turned off, so that the charging circuit 37 stops the electric charge to the external capacitor 40.

After the external capacitor 40 is electrically charged to a predetermined level and thus the terminal voltage vx is stable, the power down mode is released at the time of t1 (a "L" ("vss") level power down control signal pd is supplied to the switch 33). At the time of t1, the bias voltages vpbias1, vpbias2 are supplied to the PMOSs 31a and 31b, respectively, so that reference voltages are generated from corresponding referential voltage output terminals. In response to the "L" ("vss") level power down control signal pd, the switch 33 is turned on, thus connecting the reference voltage output terminal REFP to the external capacitor 40 via the node N1.

The third embodiment is provided with the switch 33 for connecting and disconnecting the reference voltage output terminal REFP to and from the external capacitor 40, the charging circuit 37 for supplying the charge voltage (vth) to the external capacitor 40, and the inverter 34 for controlling the charging circuit 37.

Before the power down mode is released (the pipe line ADC is turned on), the external capacitor 40 is started to be charged by the charging circuit 37 while the switch 33 is turned off. When the external capacitor 40 is charged to a predetermined level (the threshold voltage of inverter 34 vth), the inverter 34 controls the charging circuit 37 so that the charging circuit 37 stops the charging of the external capacitor 40. Subsequently, the switch 33 is turned on so as to connect the reference voltage output terminal REFP to the external capacitor 40. In synchronization with the connection of the external capacitor 40 to the reference voltage output terminal REFP, the reference voltages are generated to the pipe line ADC of FIG. 1 in response to the bias voltages vpbias1 and vpbias2, thus decreasing the time until operations of the A/D converter is stable.

Variations of the first to third embodiments will be now described. The reference voltage generation circuits according to the present invention are not limited to the first and third embodiments. The first to third embodiments can be modified to, for example, the followings (a), (b), and (c).

(a) In the reference voltage generation circuits 30, 30A, and 30B of FIG. 5, FIG. 7, and FIG. 9, the number of the resistors 31-1 to 31-9 may be changed. In addition, the PMOSs may be changed to NMOSs or other transistors, and the NMOSs also may be changed to PMOSs or other transistors.

(b) The reference voltage generation circuits 30, 30A, and 30B of the first to third embodiments are utilized for the pipe line ADC having the circuit structure as shown in FIG. 1. The reference voltage generation circuits according to the present invention may be utilized for a pipe line ADC having other circuit structures, other circuits or other apparatuses. The reference voltage generation circuit 30A of the second embodiment can be applied to, for example, other type ADC such as a sequential proportional type ADC etc. The reference voltage generation circuit 30B of the third embodiment can be applied to, for example, various circuits and apparatuses such as a PLL circuit and a DAC, each having an external capacitor by which a start-p time is influenced.

(c) The reference voltage generation circuits 30, 30A, and 30B of the first to third embodiments may have switches, respectively, for electrically discharging the external capacitor.

This application is based on Japanese Patent Application No. 2006-218124 which is herein incorporated by reference.

What is claimed is:

1. A reference voltage generation circuit comprising:
a reference voltage generation part for generating a plurality of reference voltages on corresponding reference voltage output terminals including first and second reference voltage output terminals, said first reference voltage output terminal being connected to one terminal of a charging capacitor and said second reference voltage output terminal being connected to the other terminal of said charging capacitor; and
a charging and switching part for disconnecting said charging capacitor from said reference voltage generation part so as to charge said charging capacitor and thereafter for stopping charging of said charging capacitor and connecting said charging capacitor to said reference voltage generation part in response to a terminal voltage of said charging capacitor;
wherein charging of said charging capacitor is started prior to generations of said reference voltages.

2. A reference voltage generation circuit, comprising:
a reference voltage generation part for generating a plurality of reference voltages on corresponding reference voltage output terminals including first and second reference voltage output terminals, said first reference voltage output terminal being connected to one terminal of a charging capacitor and said second reference voltage output terminal being connected to the other terminal of said charging capacitor; and
a charging and switching part for disconnecting said charging capacitor from said reference voltage generation part so as to charge said charging capacitor and thereafter for stopping charging of said charging capacitor and connecting said charging capacitor to said reference voltage generation part in response to a terminal voltage of said charging capacitor;
wherein charging of said charging capacitor is started prior to generations of said reference voltages, and
wherein
said charging and switching part is controlled by a power down control signal having first and second logic levels, and
said charge and switching part comprises
a discharge switch connected to said one terminal of said charging capacitor for discharging said charging capacitor in response to said first logic level,
a charging control circuit connected to said one terminal of said charging capacitor for generating a first charging control signal when a voltage on said one terminal of said charging capacitor is equal to or lower than a predetermined voltage and for generating a second charging control signal when said voltage on said one terminal of said charging capacitor is higher than said predetermined voltage,
a charging circuit connected to said charging control circuit and said one terminal of said charging capacitor for generating a charging voltage to said charging capacitor via said one terminal of said charging capacitor in response to said second logic level and said first charging control signal and for stopping a supply of said charging voltage in response to said second charging control signal, a switch connected across said reference voltage generation part and said charging capacitor for disconnecting said charging capacitor from said reference voltage generation part in response to said first charging control signal and for connecting said charging capacitor to said reference voltage generation part in response to said second charging control signal.

3. A reference voltage generation circuit according to claim 2, wherein said charging control circuit is configured by an inverter.

4. A pipe line analog-to-digital converter including a reference voltage generation circuit according to claim 2,
wherein said pipe line analog-to-digital converter further comprises an analog-to-digital conversion part for converting analog signals to digital signals on the basis of said reference voltages.

5. A reference voltage generation circuit, comprising:
a reference voltage generation part for generating a plurality of reference voltages on corresponding reference voltage output terminals including first and second reference voltage output terminals, said first reference voltage output terminal being connected to one terminal of a charging capacitor and said second reference voltage output terminal being connected to the other terminal of said charging capacitor; and
a charging and switching part for disconnecting said charging capacitor from said reference voltage generation part so as to charge said charging capacitor and thereafter for stopping charging of said charging capacitor and connecting said charging capacitor to said reference voltage generation part in response to a terminal voltage of said charging capacitor;
wherein charging of said charging capacitor is started prior to generations of said reference voltages, and
said charging and switching part is controlled by a power down control signal having first and second logic levels, and
said charge and switching part comprises:
a charging circuit responsive to said terminal voltage for generating a charging voltage to said charging capacitor in respond to said first logic level and for stopping a supply of said charging voltage in response to said terminal voltage; and
a switch connected across said reference voltage generation part and said charging capacitor for disconnecting said charging capacitor from said reference voltage generation part in response to said first logic level and for connecting said charging capacitor to said reference voltage generation part in response to said second logic level.

6. A pipe line analog-to-digital converter comprising a reference voltage generation circuit according to claim 5,
wherein said pipe line analog-to-digital converter further comprises an analog-to-analog conversion part for converting analog signals to digital signals on the basis of said reference voltages.

7. A reference voltage generation circuit, comprising:
a reference voltage generation part for generating a plurality of reference voltages on corresponding reference voltage output terminals including first and second reference voltage output terminals, said first reference voltage output terminal being connected to one terminal of a charging capacitor and said second reference voltage output terminal being connected to the other terminal of said charging capacitor; and a charging and switching part for disconnecting said charging capacitor from said reference voltage generation part so as to charge said charging and thereafter for stopping charging of said charging capacitor and connecting said charging capacitor to said reference voltage generation part in response to a terminal voltage of said charging capacitor;
wherein charging of said charging capacitor is started prior to generations of said reference voltages,
wherein said charging and switching part is controlled by a power down control signal having first and second logic levels, and
wherein
said charging and switching part comprises:
a charging control circuit connected to said terminal voltage for generating a first charging control signal when said terminal voltage of said charging capacitor is equal to or lower than a predetermined voltage and for generating a second charging control signal when said terminal voltage of said charging capacitor is higher than said predetermined voltage;
a charging circuit responsive to said terminal voltage and said charging control circuit for generating a charging voltage to said charging capacitor in respond to said first charging control signal and for stopping a supply of said charging voltage in response to said second charging control signal; and
a switch connected across said reference voltage generation part and said charging capacitor for disconnecting said charging capacitor from said reference voltage generation part in response to said first logic level and for connecting said charging capacitor to said reference voltage generation part in response to said second logic level.

8. A reference voltage generation circuit according to claim 7, wherein said charging control circuit is configured by an inverter.

9. A pipe line analog-to-digital converter comprising a reference voltage generation circuit according to claim 7,
wherein said pipe line analog-to-digital converter further comprises an analog-to-digital conversion part for converting analog signals to digital signals on the basis of said reference voltages.

10. A pipe line analog-to-digital converter, comprising;
a reference voltage generation circuit including a reference voltage generation part for generating a plurality of reference voltages on corresponding reference voltage output terminals, having a first and second reference voltage output terminals, said first reference voltage output terminal being connected to one terminal of a charging capacitor and said second reference voltage output terminal being connected to the other terminal of said charging capacitor, and a charging and switching part for disconnecting said charging capacitor from said reference voltage generation part so as to charge said charging capacitor and thereafter for stopping charging of said charging capacitor and connecting said charging capacitor to said reference voltage generation part in response to a terminal voltage of said charging capacitor; and
an analog-to-digital conversion part for converting analog signals to digital signals on the basis of said reference voltages,
wherein charging of said charging capacitor is started prior to generating said reference voltages.

11. A pipe line analog-to-digital converter according to claim 10,
wherein
said charging and switching part is controlled by a power down control signal having first and second logic levels, and
said charge and switching part comprises:
a discharge switch connected to said one terminal of said charging capacitor for discharging said charging capacitor in response to said first logic level;
a charging control circuit connected to said one terminal of said charging capacitor for generating a first charging control signal when a voltage on said one terminal of said charging capacitor is equal to or lower than a predetermined voltage and for generating a second charging control signal when said voltage on said one terminal of said charging capacitor is higher than said predetermined voltage;
a charging circuit connected to said charging control circuit and said one terminal of said charging capacitor for generating a charging voltage to said charging capacitor via said one terminal one terminal of said charging capacitor in respond to said second logic level and said first charging control signal and for stopping a supply of said charging voltage in response to said second charging control signal; and
a switch connected across said reference voltage generation part and said charging capacitor for disconnecting said charging capacitor from said reference voltage generation part in response to said first charging control signal and for connecting said charging capacitor to said reference voltage generation part in response to said second charging control signal.

12. A pipe line analog-to-digital converter according to claim 11, wherein said charging control circuit is an inverter.

13. A pipe line analog-to-digital converter according to claim 10,
wherein
said charging and switching part is controlled by a power down control signal having first and second logic levels, and
said charge and switching part comprises:
a charging circuit connected to said terminal voltage for generating a charging voltage to said charging capacitor in respond to said first logic level and for stopping a supply of said charging voltage in response to said terminal voltage; and
a switch connected across said reference voltage generation part and said charging capacitor for disconnecting said charging capacitor from said reference voltage generation part in response to said first logic level and for connecting said charging capacitor to said reference voltage generation part in response to said second logic level.

14. A pipe line analog-to-digital converter according to claim 10,
wherein
said charging and switching part is controlled by a power down control signal having first and second logic levels, and
said charge and switching part comprises:
a charging control circuit connected to said terminal voltage for generating a first charging control signal when said terminal voltage of said charging capacitor is equal to or lower than a predetermined voltage and for generating a second charging control signal when said terminal voltage of said charging capacitor is higher than said predetermined voltage;
a charging circuit connected to said terminal voltage and said charging control circuit for generating a charging voltage to said charging capacitor in respond to said first charging control signal and for stopping a supply of said charging voltage in response to said second charging control signal; and
a switch connected across said reference voltage generation part and said charging capacitor for disconnecting said charging capacitor from said reference voltage generation part in response to said first logic level and for connecting said charging capacitor to said reference voltage generation part in response to said second logic level.

15. A pipe line analog-to-digital converter according to claim 14, wherein said charging control circuit is an inverter.

* * * * *